United States Patent [19]
Schmid

[11] Patent Number: 4,837,768
[45] Date of Patent: Jun. 6, 1989

[54] LASER MODULE AND METHOD OF COUPLING AN OPTICAL FIBER THERETO

[75] Inventor: Peter Schmid, Tamm, Fed. Rep. of Germany

[73] Assignee: Alcatel N.V., Amsterdam, Netherlands

[21] Appl. No.: 248,560

[22] Filed: Sep. 23, 1988

[30] Foreign Application Priority Data

Sep. 26, 1987 [DE] Fed. Rep. of Germany ....... 3732433

[51] Int. Cl.$^4$ ................................................ H01S 3/04
[52] U.S. Cl. ........................................ 372/36; 372/38; 372/108
[58] Field of Search ................... 350/96.80; 372/6, 33, 372/36, 43, 69, 75, 107, 108, 99, 101; 351/200

[56] References Cited

U.S. PATENT DOCUMENTS 4,199,222 4/1980 Ikushima et al. .................. 350/96.2
4,748,632 5/1988 Preston .................................. 378/99

Primary Examiner—Léon Scott, Jr.
Attorney, Agent, or Firm—Christie, Parker & Hale

[57] ABSTRACT

In a laser module (1) having an optical fiber coupled thereto, the heat sink is formed by a metal block (6) consisting of a base plate (11) with a support for the laser diode (7) and a mounting block (14) for fixing two separate holders (19, 20) for a fiber and sleeve (18). The latter passes through a relatively large opening of the mounting block (14) which is aligned to the laser diode (7). To achieve optimum coupling, after alignment of the fiber end with the laser diode (7) by means of a micromanipulator, one of the holders a (19), e.g. a perforated plate, is fixed to the front of the mountig block (14), after which the sleeve (18) is jointed to the holder (19). This is followed by a realignment during which the sleeve (18) can be deflected around the fixing point of the front holder (19). Finally, the other holder (20) is fixed to the rear of the mounting block (14), and the sleeve (18) is joined to this holder (20).

10 Claims, 3 Drawing Sheets

LASER MODULE AND METHOD OF COUPLING AN OPTICAL FIBER THERETO

TECHNICAL FIELD

The present invention relates to a laser modules, which convert electric input signals into optical output signals and are used in optical communication systems.

This application is based on and claims priority from an application first filed in the Federal Republic of Germany on Sept. 26, 1987 under serial number P 37 32 433.0. To the extent such prior application may contain any addition information that might be of any assistance in the use and understanding of the invention claimed herein, it is hereby incorporated by reference.

BACKGROUND ART

A laser module for converting an electric input signal into an optical output signal is disclosed in published German Pat. No. 33 07 933. In that laser module, the bottom of the housing supports a cooling device on which the heat sink with the laser and the drive circuit is disposed. The end of the optical fiber, which is aligned to the active area of the laser, is embedded in a sleeve in a gastight manner, and the sleeve is hermetically sealed in bushing mounted in a sidewall of the housing. The materials used for the individual components are chosen to have the same coefficient of expansion or coefficients of expansion differing from each other as little as possible. This is to ensure that the heat produced during operation of the laser will not cause any misalignment of the fiber end. However, due to the separation between the laser support and the fiber holder, even small compressive forces applied unintentionally to the sidewall of the housing or to the bushing may cause a misalignment of the fiber end in front of the laser and, thus, a failure of the coupling arrangement.

DISCLOSURE OF INVENTION

The object of the present invention is to provide coupling arrangement in a laser module which permits accurate alignment of the fiber end and is rugged and easy to manufacture, and a method of coupling an optical fiber to a laser by means of such an arrangement.

In the laser module according to the invention, the laser support and the fiber-holding device form a compact, rigid coupling arrangement. The heat sink, supporting the laser diode and the drive circuit for the laser diode, and the fixing points of the end sleeve, which are integrated in the heat sink, are located within the housing and are thus protected from external influences. Further advantages will become apparent as the description proceeds.

BRIEF DESCRIPTION OF DRAWING

The invention will now be described in greater detail by way of example with reference to the accompanying drawings, in which.

BEST MODE FOR CARRYING OUT THE INVENTION

Figure 1:
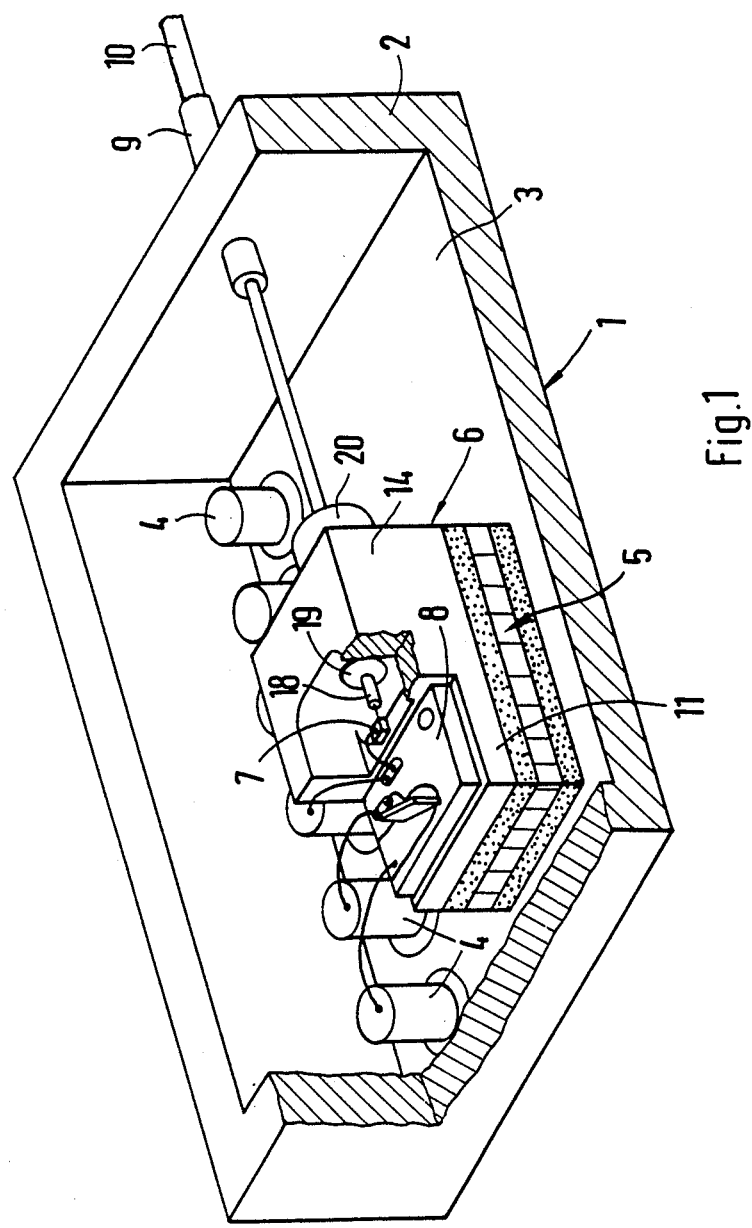
FIG. 1 is a perspective, partly sectioned view of a laser module without housing lid.

In FIG. 1, the laser module is designated 1. It has a hermetically sealable housing 2, through whose bottom 3 pass contact pins 4 for making electric connections to the laser module 1. The bottom 3 of the housing also supports a Peltier element 5, on which a heat sink formed by a metal block 6 is mounted. The heat sink supports the laser diode 7 with the drive and control circuit 8. Mounted in one wall of the housing of the laser module 1 is a hermetically sealed bushing 9 for an optical waveguide 10 in the form of a single-mode fiber.

Figure 2:
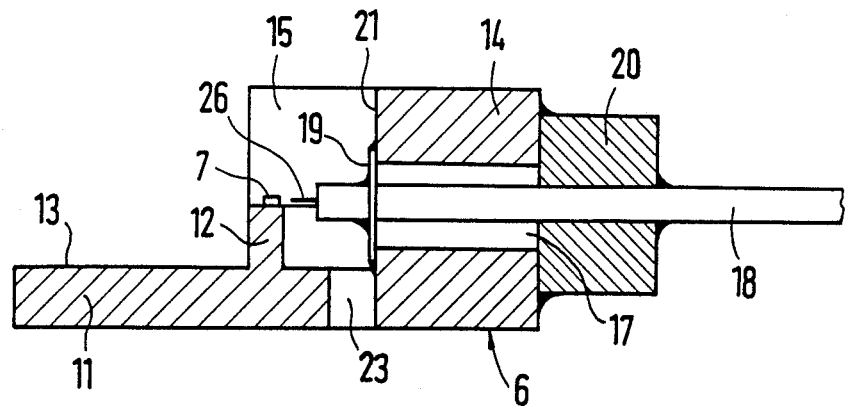
FIG. 2 is a longitudinal section of the heat sink used in the laser module of FIG. 1.
Figure 3:
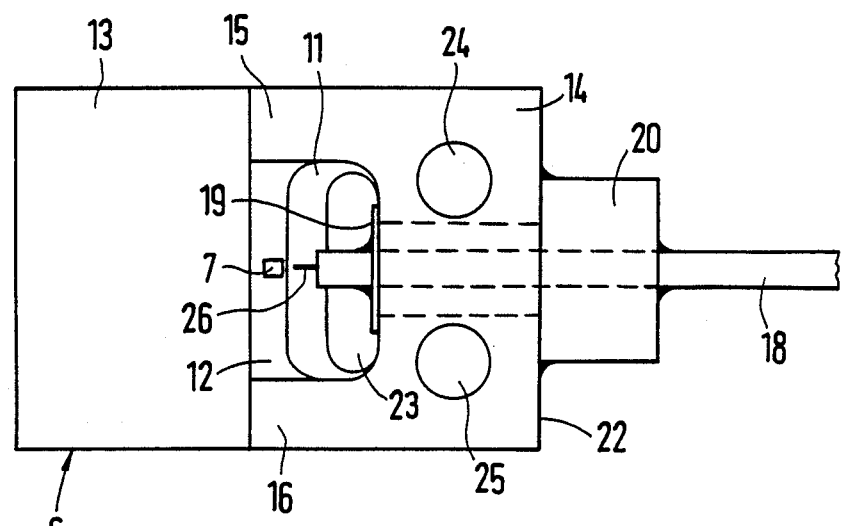
FIG. 3 is a top view of the heat sink of FIG. 2.

The metal block 6, shown in detail in FIGS. 2 and 3, is preferably formed as a single piece of copper or steel. It consists of a rectangular base plate 11 and a support 12, on which the laser diode 7 is fixed. The support 12 rises approximately in the middle between the ends of the base plate 11 and extends transversely to the long sides of the base plate. Behind the laser diode 7, the top of the base plate 11 serves as a mounting surface 13 for the drive and control circuit 8, which is implemented by thick- or thin-film technology. In front of and in spaced relationship from the laser diode 7, a mounting block 14 rising above the support 12 is disposed on the base plate 11. The mounting block 14 has two lateral cheeks 15, 16, whose outsides are flush with the long sides of the base plate 11 and which extend to the rear side of the laser support 12. This rear side flanks the mounting surface 13.

The mounting block 14 has a opening 17 for a fiber end sleeve 18, which opening 17 is aligned with the laser diode 7. The sleeve 18 contains the optical fiber, which is soldered therein, and is fixed to the front 21 and the rear 22 of the mounting block 14 by means of separate holders 17, 20. In front of the mounting block 14, a longitudinal slit 23 is made in the base plate 11 in the area between the lateral cheeks 15, 16. Two holes 24, 25 extend through the mounting block 14 and the base plate 11, one between the opening 17 and one of the sidewalls and the other between the opening 17 and the other sidewall.

The holder 19 at the front 21 of the mounting block 14 is a platelet which is loosely slipped over the sleeve 18 and is fixed to the latter on the one hand and to the mounting block 14 on the other. Such a platelet, which is made of metal and is round or angular in outline, and which may also be a commercially available shim or washer, for example, can also be used for the rear holder of the sleeve 18. However, the rear holder 20 is preferably formed by a thicker and more rugged holding member which surrounds the sleeve 18 so that there is only little play between them, and is joined to the mounting block 14 and the sleeve 18, as will be explained in greater detail below.

After the formation of the metal block 6, the laser diode 7 is fixed on the support 12 centrally with respect to the opening 17 of the mounting block 14. Then, the rear holder 20 is slipped from the front end over the separately completed sleeve 18, which is subsequently inserted, with the end 26 first, into the opening 17 of the mounting block 14 until it projects from the front 21. Thereafter, in the space limited by the support 12 and the lateral checks 15, 16, the front holder 19 is slipped over the sleeve 18 until it rests against the front 21 of the mounting block 14.

The fiber end 26 is then precisely aligned to the active area of the laser diode 7 with the aid of a micromanipulator which grasps the end 18 behind the rear holder 20 and adjusts the fiber end 26 with respect to the laser diode 7 by moving it in the X-, Y-, and Z-directions. After optimum coupling has been achieved, it is advantageous to first fix the front holder 19 to the mounting block 14, and then the sleeve 18 to the holder 19. The order of the fixing operations is unimportant, because the permanent connections, made by soldering and/or laser welding, for example, cause a slight misalignment. This, however, can be corrected by realignment because the relatively thin platelet of the holder 19, which covers an opening 17 that is relatively large compared with the diameter of the sleeve 18, represents a movable joint about which the sleeve 18 remains deflectable. The realignment of the fiber end 26 to the laser diode 7 is therefore done by laterally deflecting the rear end of the sleeve by means of the micromanipulator.

When the realignment has been completed, the rear holder 20 is fixed to the rear 22, after which the sleeve 18 is joined to the rear of the rear holder 20. Finally, the coupling between the sleeve 18 and the micromanipulator is separated.

Any lateral displacement of the sleeve 18 that may occur during the connection of the sleeve with the rear holder 20 is reduced by the leverage ratio between the front holder 19 and the fiber end 26 and between the front holder 19 and the fixing point of the rear holder 20. At the fiber end 26, therefore, such a displacement has practically no adverse effect on the coupling.

The thermal influence during the making of the connections between the sleeve 18 and the holders 19, 20 and between these holders and the mounting block 14 have no negative effects of the coupling, either. On the one hand, only few fixing points distributed over the circumferences of the sleeve 18 and the holders 19, 20 are sufficient. On the other hand, the longitudinal slit 23 in the base plate 11 and the holes 24, 25 extending through the mounting block 14 and the base plate 11 act as thermal barriers which prevent any detrimental heat flow to the laser diode 7.

Figure 4:
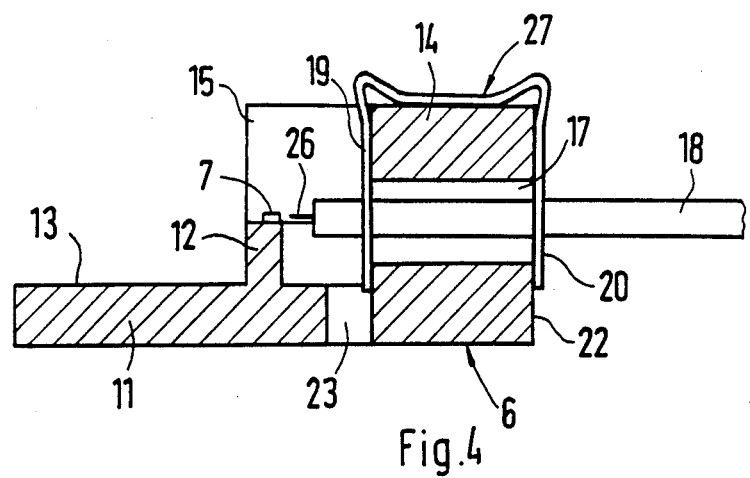
FIG. 4 shows the heat sink of FIG. 2 with different holding fixture for the sleeve.
Figure 5:
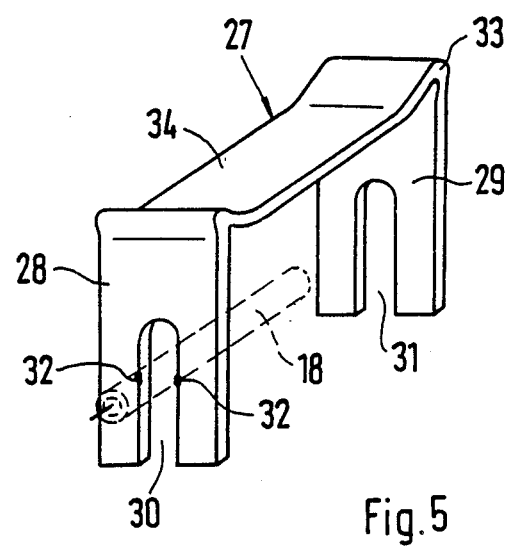
FIG. 5 is a perspective view of the clip used in the heat sink of FIG. 4.

As shown in FIGS. 4 and 5, another embodiment of the holders 19, 20 for the fiber end sleeve 18 consists of the slitted legs 28, 29 of a U-shaped clip 27. The slits 30, 31 are open at the free ends of the legs 28, 29 and have a width at least equal to the outside diameter of the sleeve 18. The clip 27 is a simple sheet-metal strip and can be formed by stamping and bending with practically no waste being produced. This clip reduces and simplifies the process steps. Before the clip 27 is fitted on, the sleeve 18 is passed through the openings 17 of the mounting block 14. Then, the slightly resilient clip 27 is fitted on in a self-locking manner, its legs 28, 29 straddling the sleeve 18. The alignment of the fiber end 26 and the fixing of the arrangement consisting of the sleeve 18 and the clip 27 are done essentially as explained above, with the fixing points, e.g., welding points 32, being located where the surface of the sleeve 18 touches the legs 28, 29 of the clip 27. To facilitate the alignment process, it may be advantageous to bend the portions 33 into an eyelet-shaped cross section or to make the portion 34 connecting the legs 28, 29 narrower than the width of the legs.

The heat sink is relatively small. For example, the base plate 11 of the metal block 6 is 5 mm in width, 8 mm in overall length, and 1 mm in height without the mounting block 14 and not more than 5 mm in height with the mounting block. The sleeve 18 is correspondingly small and has an outside diameter of about 0.5 mm and a length of 10 mm, for example. Nevertheless, this is a compact and rugged arrangement with two separate fixing planes of the sleeve 18. The heat sink can be put together within the housing, but it can also be assembled outside the housing and then mounted therein. Any external pushing or pulling force acting on the housing 2 or the bushing 9 will have no effect on the optical coupling.

I claim:

1. A laser module comprising
   a housing;
   a heat sink having a base plate portion for securing the heat sink inside the housing, said heat sink defining a mounting surface, a supporting surface, and a mounting block portion having a vertical front surface which is adjacent the supporting surface and which extends above and below a horizontal plane including at least a portion of said supporting surface, said mounting block portion defining an opening extending horizontally from said front surface to a rear surface of the mounting block portion remote from said supporting surface;
   a laser supported by said supporting surface in front of said opening;
   a drive and control circuit mounted on said mounting surface and electrically coupled to said laser;
   an end sleeve disposed in the horizontally extending opening, said end sleeve having an outer dimension substantially less than the corresponding inner dimension of said opening;
   a front holder fixed both to a front end of the end sleeve and to the mounting block portion for radially locating the front end of the sleeve relative to the front surface of the mounting block portion;
   a rear holder fixed both to a rear end of the end sleeve and to the mounting block portion for radially locating the rear end of the sleeve relative to the rear surface of the mounting block portion, and
   an optical waveguide embedded in said end sleeve and having an end optically aligned with said laser.

2. A laser module as claimed in claim 1, wherein the front holder is formed by a perforated platelet which is slipped over the end sleeve.

3. A laser module as claimed in claim 1, wherein the rear holder is a holding member which surrounds the end sleeve, wherein the relative dimensions of the end sleeve of the horizontally extending opening and of the holding member is such that there is little play between the sleeve and the holding member compared to the possible play between the rear of the end sleeve and the rear of the horizontally extending opening in the absence of any such rear holder.

4. A laser module as claimed in claim 1 wherein the mounting block portion has two lateral checks whch extend to the rear of supporting surface.

5. A laser module as claimed in claim 4, wherein in front of the mounting block portion in the area between the lateral cheeks, there is a vertically extending longitudinal slit separating the supporting surface from the mounting block portion.

6. A laser module as claimed in claim 4 wherein at either side of the horizontally extending opening, there is defined a vertically extending hole.

7. A laser module as claimed in claim 1 wherein the heat sink is formed as a single piece.

8. A laser module as claimed in claim 1, wherein at the front and the rear holders are formed by respective ones of two bifurcated legs of a U-shaped clip fitted over the mounting block portion in contact with the end sleeve.

9. A laser module as claimed in claim 8, characterized in that the clip is permanently connected with each end of the end sleeve and the mounting block portion.

10. A method of using a micromanipulator and a heat sink comprising a laser support and a waveguide mounting block of firmly coupling to securely couple the end of an optical waveguide held by an end sleeve in alignment with a light-emitting laser diode supported by the laser support, said method comprising the steps:

(a) slipping a rear holder over the end sleeve;
(b) inserting the end sleeve into an opening of the mounting block;
(c) slipping a front holder over the end sleeve until it rests against the mounting block;
(d) coupling the micromanipulator with a rear end of the end sleeve and aligning the end of the optical waveguide to a laser diode;
(e) fixing the front holder to the mounting block;
(f) joining the front end of the end sleeve to the front holder;
(g) realigning the end of the optical waveguide to the laser diode by laterally deflecting the rear end of the end sleeve by means of the micromanipulator;
(h) fixing the rear holder to the mounting block;
(i) joining the end sleeve to the rear holder, and
(j) uncoupling the end sleeve from the micromanipulator.

* * * * *

UNITED STATES PATENT AND TRADEMARK OFFICE
CERTIFICATE OF CORRECTION

PATENT NO. : 4,837,768

DATED : June 6, 1989

INVENTOR(S) : Peter Schmid

It is certified that error appears in the above-identified patent and that said Letters Patent is hereby corrected as shown below:

On the Front Page:

Abstract, line 11, change "mountig" to -- mounting --.
Abstract, line 12, change "jointed" to -- joined --.

In the Specification:

Column 1, line 6, before "laser" delete -- a --.
Column 1, line 14, change "addition" to -- additional --.
Column 1, line 27, before "bushing" insert -- a --.
Column 1, line 42, before "coupling" insert -- a --.
Column 1, line 65, before "different" insert -- a --.

Column 2, line 31, before "opening" change "a" to -- an --.

Column 3, line 30, change "influence" to -- influences --.

UNITED STATES PATENT AND TRADEMARK OFFICE
CERTIFICATE OF CORRECTION

PATENT NO. : 4,837,768

DATED : June 6, 1989

INVENTOR(S) : Peter Schmid

It is certified that error appears in the above-identified patent and that said Letters Patent is hereby corrected as shown below:

In the Claims:

Column 4, line 54, change "checks whch" to -- cheeks which with --.
Column 4, line 67, before "the" delete -- at --.

Column 5, line 9, after "block" delete -- of firmly coupling --.

Signed and Sealed this

Twelfth Day of June, 1990

Attest:

HARRY F. MANBECK, JR.

Attesting Officer     Commissioner of Patents and Trademarks